US008581091B2

(12) United States Patent
Geyer et al.

(10) Patent No.: US 8,581,091 B2
(45) Date of Patent: Nov. 12, 2013

(54) SERIAL CIRCUIT OF SOLAR CELLS WITH INTEGRATED SEMICONDUCTOR BODIES, CORRESPONDING METHOD FOR PRODUCTION AND MODULE WITH SERIAL CONNECTION

(75) Inventors: Volker Geyer, Niederkruechten (DE); Patrick Kaas, Eindhoven (NL)

(73) Assignee: Scheuten Glasgroep, Venlo (NL)

( * ) Notice: Subject to any disclaimer, the term of this patent is extended or adjusted under 35 U.S.C. 154(b) by 988 days.

(21) Appl. No.: 10/574,378

(22) PCT Filed: Sep. 24, 2004

(86) PCT No.: PCT/EP2004/010781
§ 371 (c)(1),
(2), (4) Date: Oct. 10, 2006

(87) PCT Pub. No.: WO2005/034170
PCT Pub. Date: Apr. 14, 2005

(65) Prior Publication Data
US 2007/0089780 A1    Apr. 26, 2007

(30) Foreign Application Priority Data
Oct. 2, 2003    (EP) .................................... 03022098

(51) Int. Cl.
*H01L 31/042*    (2006.01)
(52) U.S. Cl.
USPC ............................ 136/250; 136/251; 136/245
(58) Field of Classification Search
USPC ....................................................... 136/250
See application file for complete search history.

(56) References Cited

U.S. PATENT DOCUMENTS

| 3,025,335 A | * | 3/1962 | Ralph | 136/250 |
| 3,736,476 A | | 5/1973 | Te Velde | 317/234 R |

(Continued)

FOREIGN PATENT DOCUMENTS

| DE | 100 52 914 A1 | 5/2002 |
| EP | 940 860 A1 | 9/1999 |
| WO | WO 03041177 A1 * | 5/2003 |

OTHER PUBLICATIONS

International Search Report in PCT/EP2004/010781 dated Mar. 31, 2005.

(Continued)

*Primary Examiner* — Miriam Berdichevsky
(74) *Attorney, Agent, or Firm* — Marshall, Gerstein & Borun LLP

(57)  ABSTRACT

The invention relates to a method for production of a serial circuit of solar cells with integrated semiconductor bodies, a serial circuit produced thus and photovoltaic modules, comprising at last one serial circuit. The invention is characterized in that conducting bodies (20) and semiconducting bodies (30) are applied to an insulating support layer, according to a pattern, whereby said pattern provides at least one dividing line (21) of conducting bodies. The regions adjacent to the conducting bodies are provided with spherical or particle-shaped semiconducting bodies (30). Parts of the semiconductor bodies are removed and the support layer coated on the side with a back contact layer (50). The back contact layer of a semiconducting body is thus exposed, for example, and brought into contact with the back contact layer (50) of the solar cell. The other side of the support layer (10) is provided with a front contact layer. By the introduction of two separating layers along a row of conducting bodies, the flow of current from the solar cells produced with the integrated semiconductor bodies can run such that the cell regions between the conducting body rows are connected in series. Individual series circuits can be connected to each other in the manner of tiles, such that each back contact is connected to a front contact.

43 Claims, 3 Drawing Sheets

(56) References Cited

U.S. PATENT DOCUMENTS

| | | | | |
|---|---|---|---|---|
| 4,173,494 | A | | 11/1979 | Johnson et al. .............. 136/89 |
| 4,407,320 | A | | 10/1983 | Levine .......................... 136/250 |
| 4,582,588 | A | | 4/1986 | Jensen et al. ............... 204/37.6 |
| 4,638,111 | A | * | 1/1987 | Gay ............................. 136/249 |
| 4,913,744 | A | * | 4/1990 | Hoegl et al. ................. 136/244 |
| 5,356,656 | A | * | 10/1994 | Kuo et al. ...................... 438/96 |
| 5,578,503 | A | | 11/1996 | Karg et al. ...................... 437/5 |
| 5,626,688 | A | * | 5/1997 | Probst et al. ................. 136/265 |
| 5,679,176 | A | * | 10/1997 | Tsuzuki et al. .............. 136/251 |
| 6,281,427 | B1 | * | 8/2001 | Mitsuhiro et al. ........... 136/250 |
| 6,310,281 | B1 | * | 10/2001 | Wendt et al. ................. 136/256 |
| 6,399,412 | B1 | * | 6/2002 | Asai et al. ....................... 438/63 |
| 6,437,234 | B1 | * | 8/2002 | Kyoda et al. ................. 136/250 |
| 6,586,670 | B2 | * | 7/2003 | Yoshikawa ................... 136/263 |
| 6,620,996 | B2 | * | 9/2003 | Sugawara et al. ............ 136/250 |
| 6,664,567 | B2 | * | 12/2003 | Kyoda et al. .................. 257/53 |
| 2002/0179143 | A1 | * | 12/2002 | Haussler et al. ............. 136/265 |
| 2003/0102023 | A1 | * | 6/2003 | Delahoy ....................... 136/262 |

OTHER PUBLICATIONS

International Preliminary Examination Report in PCT/EP2004/010781 dated Feb. 14, 2006.

First Examination Report dated Apr. 21, 2008 from the Patent Office of India.

English-language translation of Second Office Action for corresponding Chinese Application No. 200480027853.9, dated Nov. 13, 2009.

Bhattacharyya et al., "Effect of substrate on the structural and optical properties of chemical-bath-deposited CdS films" *Thin Solid Films* 288;171-186 (1996).

Cairns et al., "The mechanical reliability of sputter-coated indium tin oxide polyester substrates for flexible display and touchscreen applicatons" *Mat. Res. Soc. Symp. Proc.* vol. 666; F3.24.1-F3.24.12 (2001).

Neerinck et al. "Depth profiling of thin ITO films by grazing incidence X-ray diffraction" *Thin Solid Films* 278;12-17 (1996).

* cited by examiner (a)

(b)

(c)

(a)

(b)

SERIAL CIRCUIT OF SOLAR CELLS WITH INTEGRATED SEMICONDUCTOR BODIES, CORRESPONDING METHOD FOR PRODUCTION AND MODULE WITH SERIAL CONNECTION

BACKGROUND OF THE INVENTION

1. Field of the Invention

The invention relates to a serial connection of solar cells having integrated semiconductor elements.

The invention also relates to a method for the production of a serial connection of solar cells having integrated semiconductor elements.

The invention also relates to a photovoltaic module with a serial connection of solar cells.

2. Description of Related Technology

In industry, there is an increasing demand for methods for producing serial connections of solar cells. Particularly in the special field of photovoltaics where semiconductor particles are incorporated into a layer system in order to form a p-n junction, it is practical to combine areas of thin layers and semiconductor particles to form cells or arrays and to connect these cells in series so as to be able to tap higher voltages. The problem of the serial connection of solar cells having incorporated semiconductor particles, however, has not yet been satisfactorily solved.

DE 100 52 914 A1, for instance, describes a semiconductor component system in which a semiconductor structure formed of layers with incorporated semiconductor particles is completely punctured at predefined places. Insulated conductor pins are inserted into these holes that have a size of a few hundred μm and these pins are firmly connected to a conductive layer on the front. The serial connection of the arrays is achieved by installing conductor bridges, after which the arrays are electrically separated from each other at the end of the procedure. The disconnection points are encapsulated with insulating and concurrently adhesive materials.

In another embodiment, which is also described in DE 100 52 914 A1, the approach taken during the production of the semiconductor component system is that different semiconductor component types (n-type material and p-type material) are applied alternately onto defined surface areas. Thus, areas with positive or negative electrodes are alternately formed on one side of a system, and these electrodes can be connected in series by an integrated connection. For this purpose, the electrode layers are interrupted alternately on the top and on the bottom. The placement of different semiconductor component types in order to create a surface with different electrodes, however, is an expensive method.

Moreover, U.S. Pat. No. 4,407,320 discloses a method for the production of solar cells in which spherical semiconductor elements are incorporated into an insulating layer. The spheres have a semiconductor of n-type material on one side whereas they have a semiconductor of p-type material on the other side. In each case, a conductive layer is applied onto both sides of the insulating layer in order to connect the spheres to each other. Furthermore, conductive separation lines are made consisting of spheres, a paste or, for example, a wire. In order to produce a serial connection, alternating cuts are made into the conductive layers on both sides of the conductive separation line.

It is also a known procedure to configure independent spherical semiconductor elements that constitute complete semiconductors, including the requisite electrodes. For example, EP 0 940 860 A1 describes using a spherical core to make a spherical semiconductor element by means of masking, etching steps and the application of various material layers. Such semiconductor elements can be used as solar cells if the p-n junction is selected in such a way that it can convert incident light into energy. If the p-n junction is configured in such a way that it can convert an applied voltage into light, then the semiconductor element can be employed as a light-emitting element.

Moreover, U.S. Pat. No. 5,578,503 discloses a method for the rapid production of chalcopyrite semiconductor layers on a substrate in which individual layers of the elements copper, indium or gallium and sulfur or selenium are applied onto a substrate in elemental form or as a binary interelemental compound. The substrate with the layer structure is then quickly heated up and kept at a temperature of $\geq 350°$ C. [$\geq 662°$ F.] for between 10 seconds and one hour.

GENERAL DESCRIPTION OF THE INVENTION

Therefore, the invention provides a method for producing serial connections of solar cells having integrated semiconductor elements that can be carried out with just a few simple process steps.

Moreover, the invention provides a serial connection of solar cells having integrated semiconductor elements that is produced with just a few process steps that are simple to carry out.

Furthermore, the invention to provide provides a photovoltaic module with serially connected solar cells.

In the method according to the invention for producing a serial connection of solar cells having integrated semiconductor elements, one or more conductive elements and spherical or grain-shaped semiconductor elements are incorporated into an insulating support layer according to a pattern, whereby the elements protrude from the surface of the support layer on at least one side of the support layer, and the pattern calls for at least one continuous separation line having a width B consisting of conductive elements. The areas next to a separation line or between several lines are fitted with semiconductor elements.

In an especially preferred embodiment of the invention, the pattern in the support layer provides that a distance exists between a separation line and an area that is fitted with semiconductor elements, so that, next to a separation line, a thin strip is formed into which separation cuts can be made without the conductive elements or the semiconductor elements being touched and likewise being cut. It is also possible not to have any distance so that the separation cuts are made in such a way that, as a result, parts of the conductive elements and/or of the semiconductor elements are cut off.

The elements incorporated into the support layer can be, for example, elements made of solid material or else coated substrate cores. Examples of conductive elements can be, for example, particles made of a conductive material or particles coated with a conductive material. In a preferred embodiment of the invention, the conductive material is copper. In another especially preferred embodiment of the invention, particles made from I-III-VI compound semiconductors or substrates coated with I-III-VI compound semiconductors are used as the semiconductor elements, so that the designation "semiconductor element" can refer to any element in which one constituent is a semiconductor material.

In another embodiment of the invention, the conductive elements are formed by one or more strips. This has the advantage that a continuous separation line can be created. Furthermore, it has proven to be advantageous to incorporate a conductive element in the form of a paste into the support layer. This is especially advantageous when the support layer is a matrix with recesses for elements that are to be incorporated. Thus, the conductive paste can be applied onto one side of the matrix and can be pressed through the recesses to the other side of the matrix so that both sides have conductive separation lines that are contacted all the way through the support layer.

According to the invention, parts of the semiconductor elements are removed from one side of the support layer. This is done in order to expose a surface area of the semiconductor element that is to be contacted with the back contact of the solar cell. This is preferably a back contact layer that was deposited onto the semiconductor element below a semiconductor layer so that removal of the semiconductor layer is necessary. Furthermore, a back contact layer is applied onto the side of the support layer on which the semiconductor elements have been removed and a front contact layer is applied onto the other side of the support layer. The front contact layer and the back contact layer consist of a conductive material.

In order to produce a solar cell, depending on the envisaged embodiment, other function layers can be applied, which can include, for example, a buffer layer made of CdS, intrinsic zinc oxide and/or a transparent conductive oxide (TCO) layer. In another especially preferred embodiment of the invention, in addition to a back contact layer and a semiconductor layer, the semiconductor elements comprise other function layers, which can likewise include a buffer layer made of CdS, intrinsic zinc oxide and/or a TCO layer.

In another process step, two separation cuts are made along a row of conductive elements, whereby a first separation cut is made in the front contact layer and a second separation cut is made in the back contact layer. Here, the separation cuts are on different sides of the appertaining separation line consisting of conductive elements, and they penetrate the back contact layer all the way to the support layer.

In an especially preferred embodiment of the invention, the row of conductive elements is essentially straight and extends between two edges of the support layer that are opposite from each other. However, the pattern of separation lines consisting of conductive elements and areas between them in the form of solar cells can be selected freely so that, for instance, curved separation lines are also possible.

The conductor elements and semiconductor elements can be, for example, scattered on and then pressed in. In an especially preferred embodiment of the invention, the spherical or grain-shaped elements are incorporated into a matrix of a support layer having prepared recesses for the elements. The elements can be incorporated into the support layer, for example, by means of a heating and/or pressing procedure. Various physical vapor deposition (PVD) and/or chemical vapor deposition (CVD) methods or other methods that have been adapted to the type of the layer in question can be used in order to apply the front contact layer and the back contact layer. If, for example, a conductive adhesive is used, brushing on or spreading on the adhesive has proven to be advantageous.

The method according to the invention makes it possible to generate a serial connection in which the current flows through an area of semiconductor elements of the front contact layer into the separation line consisting of conductive elements. The further flow of the current out of the conductor elements into the next area of semiconductor elements of the front contact layer, however, is prevented by a first separation cut so that the current flows via the conductive elements into the back contact. Here, the current flow through the back contact is prevented by a second separation cut in the back contact. Thus, between the separation lines consisting of conductive elements, areas are formed that function as solar cells and that are connected in series with each other.

For this purpose, the serial connection of solar cells having integrated semiconductor elements has at least one insulating support layer in which conductive elements and spherical or grain-shaped semiconductor elements are incorporated according to a pattern, whereby the elements protrude from the layer on at least one side of the support layer. The pattern calls for least one continuous separation line having a width B consisting of conductive elements, whereas the areas next to a row or between several rows are fitted with semiconductor elements.

The serial connection also has a front contact layer and a back contact layer, whereby the back contact layer lies on the side of the support layer on which parts of the semiconductor elements have been removed. In each case, two separation cuts are made along a separation line consisting of conductive elements, whereby a first separation cut is made in the front contact layer and a second separation cut is made in the back contact layer. The separation cuts are on different sides of each row of conductive elements, and they penetrate the back contact layer all the way to the support layer.

When the serial connection is produced with the method according to the invention, on the side of the support layer on which the back contact layer of the solar cell is arranged, at least one of the spherical or grain-shaped semiconductor elements has a surface via which a direct contact is established between the back contact layer of the solar cell and a back contact layer of the semiconductor element. If the semiconductor elements are, for example, a substrate coated with a back contact and with a semiconductor, then the coating is removed from the semiconductor elements to such an extent as to form a surface consisting of back contact that can be contacted with the back contact layer of the solar cell. If, in addition to a back contact layer and a semiconductor layer, the semiconductor elements have other function layers, then these were likewise removed so as to expose a surface consisting of the back contact.

The essential advantage of the serial connection according to the invention of solar cells and of the appertaining method for its production lies in the simple configuration of the connection of the solar cell areas, which calls for only a few processing steps. The requisite conductive elements can be incorporated in various forms and in different ways and the creation of the separation cuts is likewise a simple process step.

If spherical or grain-shaped elements are used, these can be incorporated with the same method as the semiconductor elements so that no additional methods or devices have to be developed and implemented for this purpose. If, for example, a paste that is applied onto a support matrix having recesses is used as the conductive element, then two separation lines that are joined via the support layer can be created in a simple manner. Moreover, the additional material requirements are low since only conductive elements have to be incorporated. The separation cuts that are made do not interfere with the overall arrangement since the weakening of the overall structure is very slight.

BRIEF DESCRIPTION OF THE DRAWINGS

Further advantages, special features and practical embodiments of the invention will be apparent from the following description of preferred embodiments making reference to the figures.

The figures show the following.

DETAILED DESCRIPTION

Figure 1:
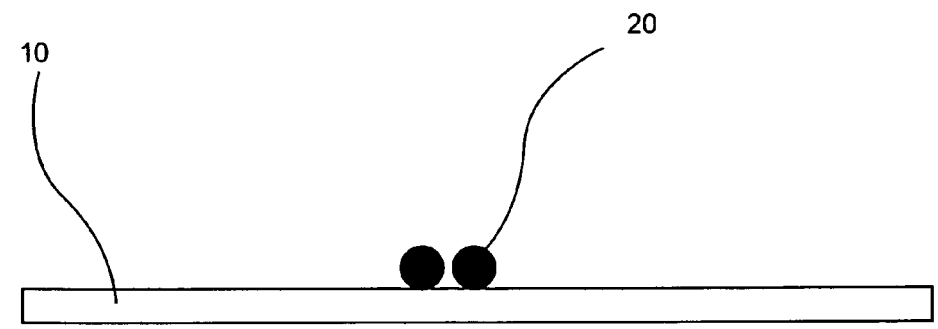
FIG. 1 shows, in illustrations (a) to (c), the embedding of spherical semiconductor and conductor particles into a support layer.
Figure 1:
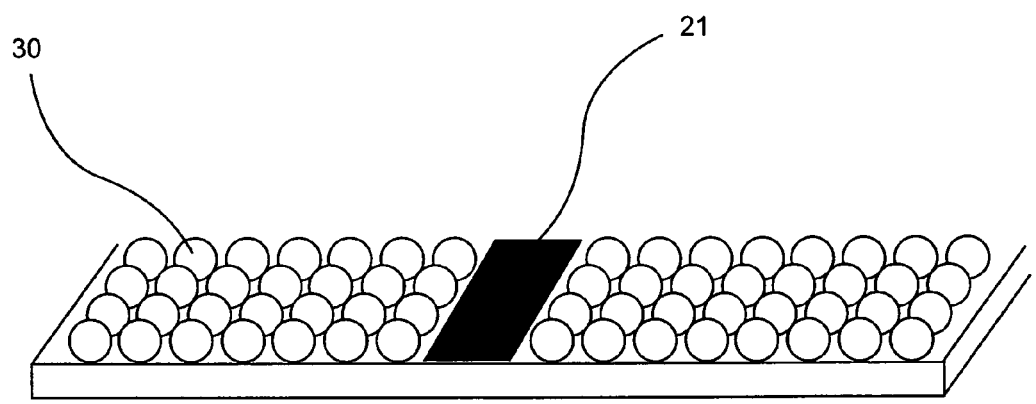
Figure 1:
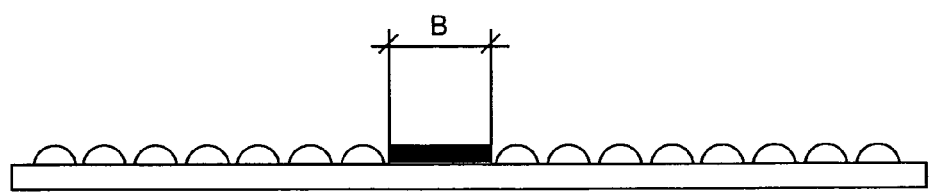

Illustrations (a) to (c) of FIG. 1 show the incorporation of spherical or grain-shaped conductive elements 20 and semiconductor elements 30 into an insulating support layer 10. It has proven to be advantageous here to use a flexible film as the support layer. The support layer preferably includes a thermoplastic material into which the conductive elements can be pressed. Polymer has proven to be especially practical and it can be, for example, a polymer from the group comprising epoxides, polycarbonates, polyesters, polyurethanes, polyacrylics and/or polyimides.

The embedded elements are preferably spherical or grain-shaped particles with conductive or semiconductive properties. In addition to the pure spherical shape, the elements can also have irregular shapes like those of grains having any contour. These also include, for example, cubes, parallelepipeds or pyramids. Therefore, spheres or grains made of conductive materials such as copper can be used as the conductive elements 20. In another especially preferred embodiment of the invention, the conductive elements are incorporated in the form of strips or a paste in the shape of a separation line.

The semiconductor elements are formed completely or partially of suitable semiconductor materials used in photovoltaics. In an especially preferred embodiment of the invention, the semiconductor materials come from the class of the compound semiconductors, including for instance, copper indium diselenide, copper indium disulfide, copper indium gallium diselenide or copper indium gallium diselenide disulfide. In another embodiment of the invention, the semiconductor elements consist of silicon semiconductors. These can be semiconductors made of solid material or substrate cores coated with semiconductor materials.

The conductive elements and the semiconductor elements are incorporated into the support layer 10 in such a way that they protrude from the surface of the layer on at least one side of the support layer. For this purpose, the elements can be applied, for example, by means of scattering, dusting and/or printing, after which they can be pressed in. In order to press the elements into the support layer, it can, for instance, be heated up. The elements can be arranged into a desired pattern, for example, using an auxiliary means, and in this manner, placed onto or into the support layer.

In an especially preferred embodiment of the invention, the elements are incorporated into a prepared matrix of a support layer in which there are recesses into which the appertaining elements are inserted. In order to attach the elements to the support layer, a heating and/or pressing procedure can be carried out. For example, if a paste is used as the conductive element, the paste can be applied onto desired areas of the matrix and pressed into the recesses located there. The paste can be spread on the back of the support layer so that a separation line is formed on both sides of the insulating support layer which are connected to each other by the recesses.

The conductive elements are incorporated into the support layer according to a pattern that calls for at least one essentially straight separation line having a certain width B consisting of conductive elements 20. In this context, the fact that the row is essentially straight means that slight deviations from a straight line are also comprised. If a geometrically different delineation between individual solar cells is to be made for certain applications, a different course of the rows of conductive elements can be selected such as, for example, curved separation lines.

Preferably, the separation line formed of conductive elements extends between two edges of the support layer 10 that are opposite from each other. The width of the rows of conductive elements is preferably in the order of magnitude of B=10 µm to 3 mm and, depending on the dimensions of the conductive elements employed, is defined by one or more conductive elements. In an especially preferred embodiment of the invention, the width of the separation lines is between 10 µm and 30 µm. If spherical or grain-shaped particles are used as the conductive elements, the width of the separation lines is a function of the diameter of the particles employed. Consequently, the width of the separation lines can also be in the order of magnitude of one or more diameters of a conductive sphere, especially between 10 µm and 500 µm.

Depending on the desired width of a solar cell that is to be connected, a support layer is divided into appropriate areas by several rows of conductive elements. The areas next to a separation line or between several separation lines are fitted with semiconductor elements. The width of a solar cell thus limited is preferably in the order of magnitude of 1 mm to 3 cm. In an especially preferred embodiment of the invention, the width of a solar cell is between 3 mm and 5 mm. The width of a support layer with a serial connection thus formed is preferably in the order of magnitude of 5 cm to 30 cm, whereby it has proven to be especially advantageous to have strip-like modules consisting of several serially connected solar cells that preferably have a width of approximately 10 cm.

Figure 2:
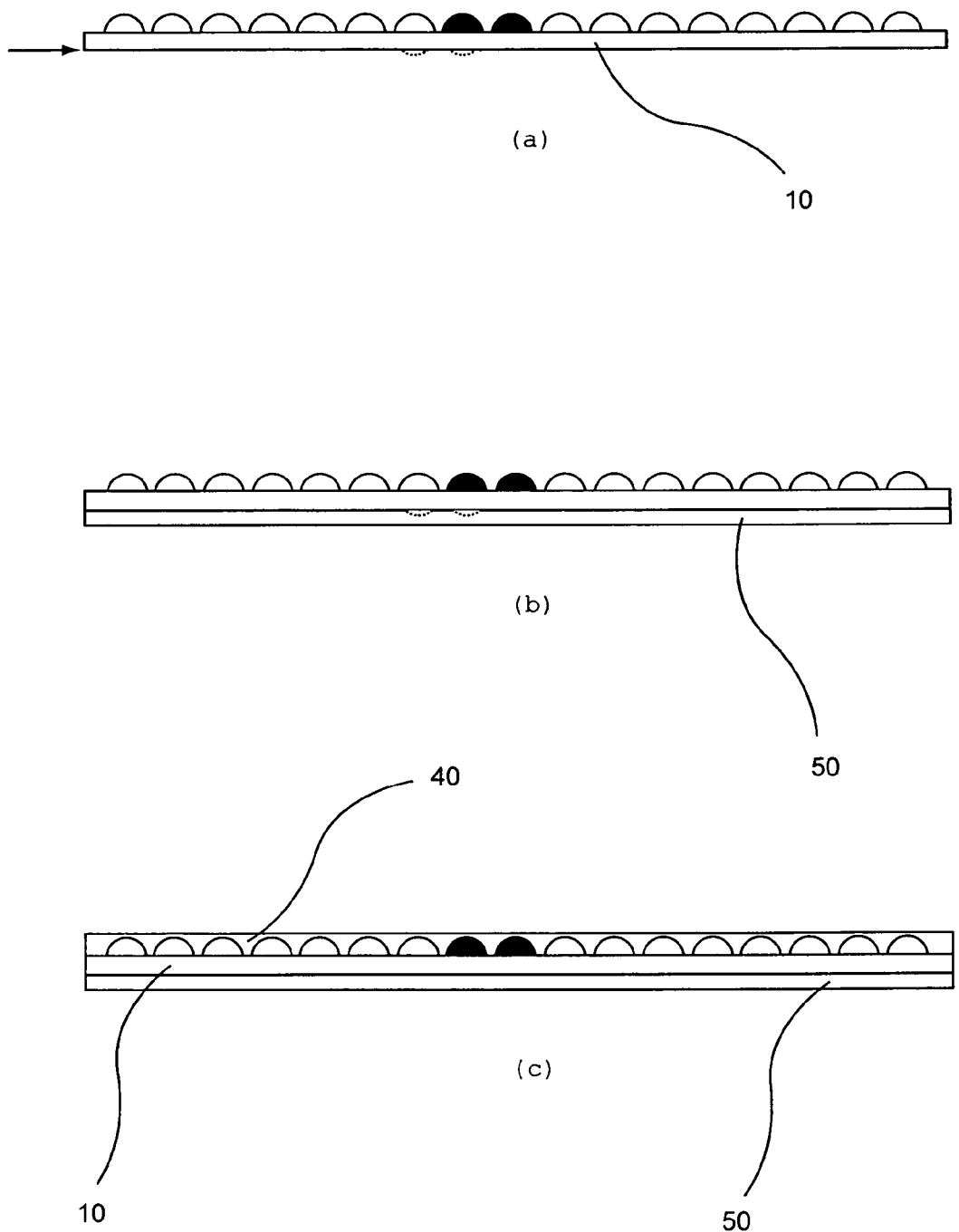
FIG. 2 shows, in illustrations (a) to (c), the structure of front contact layers and back contact layers.

The illustrations (a) to (c) of FIG. 2 show the formation of the layer structure for the production of a solar cell having integrated semiconductor elements. In an especially preferred embodiment of the invention, as a first step, material is removed from one side of the support layer 10. This side is removed down to a layer thickness at which parts of the incorporated elements have likewise been removed. The areas of the elements that have likewise been removed are shown in illustration (a) by the remaining contours of two conductive and semiconductor elements shown by a broken line. The removal of the support layer, however, can also take place at other points in time that precede the application of a later back contact 50 on this side.

In another embodiment of the invention, after the incorporation, the semiconductor elements protrude from one side of the support layer to such an extent that parts of them can be removed without a simultaneous removal of the support layer being necessary. The conductive elements, the semiconductor elements and/or the support layer can be removed, for example, by mechanical methods such as grinding, polishing, chemical or wet-chemical methods (processes) such as etching, photolithography or thermal energy input, for instance, by means of lasers or radiation with light having a suitable wavelength or wavelength range or by other thermal methods.

The extent of the removal depends primarily on the semiconductor elements employed. If, for example, spherical or grain-shaped substrate cores are used, which are coated at least with one back contact layer and with one semiconductor layer, the removal is carried out until the back contact layer of the particle is exposed in order to establish the contact with the back contact of the solar cell. In an especially preferred embodiment of the invention, the semiconductor elements are glass substrate cores that are coated with a back contact made of molybdenum and with a semiconductor. In this case, the removal of the support layer is carried out down to a layer thickness in which the molybdenum layer of the elements is exposed.

In this context, the removal also depends on whether all of the semiconductor elements are situated at equal depths in the support layer. If the semiconductor elements are embedded at different depths or if the size of the elements varies, then the possibility exists that not all of the semiconductor elements will have their coating removed down to their back contact layer.

In another process step, a back contact layer 50 is applied onto the side of the support layer 10 on which at least parts of the semiconductor elements have been removed. Conductive substances such as metals are used as the material for this back contact. It is also possible to use transparent conductive oxides (TCOs) or substances from various polymer classes. Especially suitable materials are, for example, epoxy resins, polyurethanes and/or polyimides that have been provided with suitable conductive particles such as carbon, indium, nickel, molybdenum, iron, nickel chromium, silver, aluminum and/or the corresponding alloys or oxides. Another possibility comprises intrinsic conductive polymers. These include, for example, polymers from the group of the PANis. The back contact can be produced by means of PVD methods such as sputtering and evaporation coating or CVD methods such as PE-CVD or MO-PVD or else with another technique that is adapted to the back contact material.

In another process step, a conductive front contact layer 40 is deposited onto the side of the support layer on which no processing of the elements was carried out. This can also be done with PVD or CVD methods as well as other methods that are adapted to the front contact material. Various transparent conductive oxides (TCOs) such as, for instance, aluminum-doped zinc oxide (ZnO:Al) (also called AZO), indium tin oxide (ITO) or fluorine-doped tin oxide ($SnO_2$:F) can be used as the material for the front contact. It has proven to be advantageous to use a transparent front contact whose transmission is preferably adapted to the semiconductor in question.

Other function layers can be deposited before and/or after the deposition of a front contact and/or a back contact. These include, for example, a buffer layer made of CdS, intrinsic zinc oxide and/or another TCO layer. In an especially preferred embodiment of the invention, these function layers have already been deposited onto the semiconductor elements employed so that there might not be a need for another deposition procedure in order to produce a solar cell.

Figure 3:
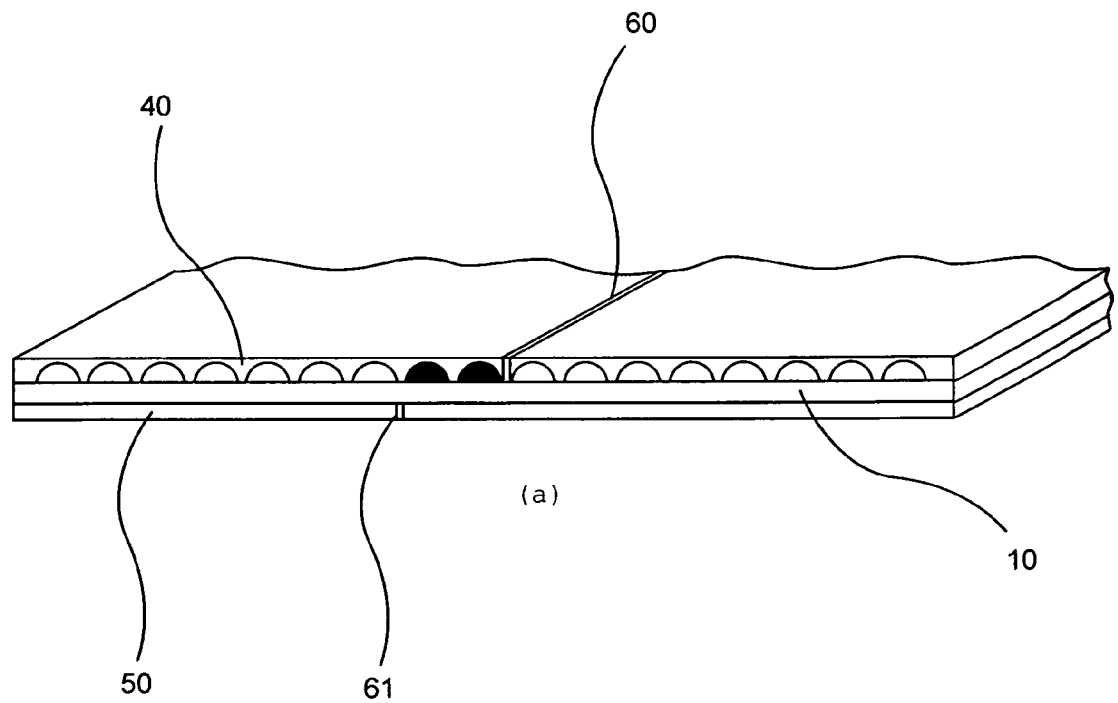
FIG. 3 shows, in illustrations (a) to (b), the serial connection according to the invention of solar cells having integrated semiconductor particles.
Figure 3:
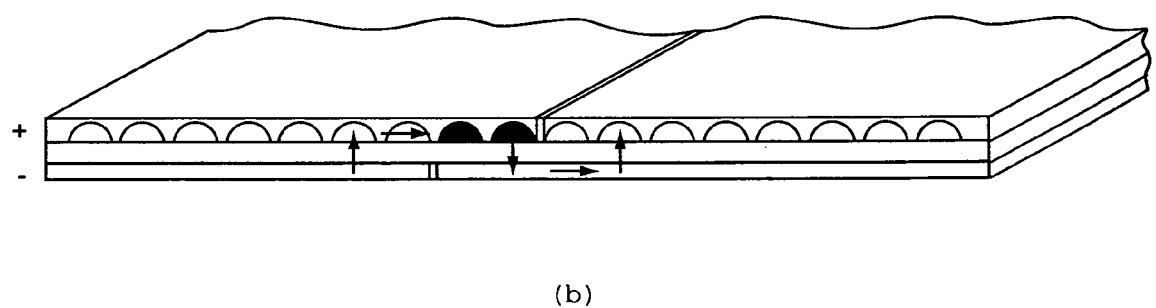

As another essential process step, two separation cuts 60 and 61 are made along a row of conductive elements as is shown in illustration (a) of FIG. 3. Here, a separation cut 60 is made into the front contact layer 40 and a separation cut 61 is made into the back contact layer, whereby said separation cuts lie on different sides of the row of conductive elements 20. The separation cuts can be made using methods such as cutting, scoring, thermal energy input such as, for example, laser cutting or else by means of photolithographic processes.

In an especially preferred embodiment of the invention, the separation cuts thus created are filled up with an insulating material in order to achieve the flattest possible surface of the solar cell connection. However, this step is optional since the requisite depth of the separation cuts 60; 61 is very small due to the fact that the thin front contact and back contact layers are in the μm range.

Once the procedure has been completed and all deposition and separation steps have been carried out, the resulting layers with the semiconductor elements constitute a serial connection of solar cells that can be used in a photovoltaic module. Depending on the embodiment of the photovoltaic module, it can comprise one or more serial connections. The resultant current course is indicated in illustration (b) of FIG. 3 by several arrows. In the embodiment shown, the negative front contact is on the top whereas the positive back contact is on the bottom. The current flows via the semiconductor element 30 in the front contact into the conductive element 20 and from there into the back contact 50, since a further current flow is prevented by the first separation cut 60. The current flow through the back contact 50 is prevented by the second separation cut 61.

Figure 4:
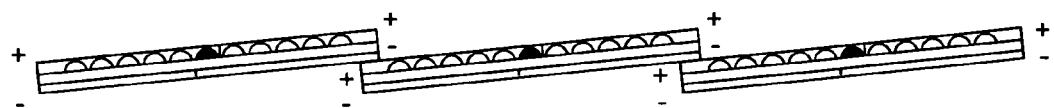
FIG. 4 shows, an especially preferred embodiment of a shingle-like connection of several serial connections.

In an especially preferred embodiment of the invention, such a serial connection is joined to at least one other corresponding serial connection so as to form a larger module. This is done, for example, in that the individual serial connections are configured so as to be strip-like with a width in the order of magnitude of 5 cm to 30 cm and the sub-modules thus formed are laid over each other at the edges like shingles. This is shown in FIG. 4. Hence, a back contact comes to lie on a front contact and the individual modules are, in turn, connected in series. The contacting between each front contact layer and back contact layer can be done by means of a conductive adhesive such as silver epoxide.

LIST OF REFERENCE NUMERALS 10 support layer, film
20 conductive element, conductor element
21 separation line
30 semiconductor element, spherical or grain-shaped
40 front contact layer
50 back contact layer
60, 61 separation cuts

The invention claimed is:

1. A method for producing a serial connection of solar cells having integrated semiconductor elements, comprising the steps of:
incorporating one or more conductive elements into an insulating support layer in a pattern, whereby the conductive elements protrude from the surface of the support layer on at least one side of the support layer, and the pattern defines at least one separation line having a width B and comprising at least one conductive elements;
incorporating a plurality of spherical or grain-shaped semiconductor elements into the insulating support layer according to a pattern, whereby the semiconductor elements comprise substrate cores that are coated at least with one conductive back contact layer made of molybdenum and with one semiconductor layer made of a I-III-VI compound semiconductor arranged above it, the semiconductor elements protrude from the surface of the support layer on at least one side of the support layer, and the pattern provides that the areas next to a separation line or between several separation lines comprising conductive elements are fitted with semiconductor elements;
removing parts of the semiconductor elements on one side of the support layer until the back contact layer of the semiconductor elements is exposed;

applying a conductive back contact layer (50) onto the side of the support layer on which parts of the semiconductor elements have been removed;

applying a continuous conductive front contact layer comprising a transparent conductive oxide (TCO) onto the side of the support layer on which no semiconductor elements have been removed, whereby a layer made of intrinsic zinc oxide and a layer made of transparent conductive oxide (TCO) had already been deposited onto each of the spherical or grain-shaped semiconductor elements employed;

making two separation cuts along a separation line comprising conductive elements, including making a first separation cut in the front contact layer and making a second separation cut in the back contact layer, the separation cuts being on different sides of the separation line, and the separation cuts penetrating the back contact layer all the way to the support layer.

2. The method according to claim 1, wherein the spherical or grain-shaped semiconductor elements comprise a layer made of transparent conductive oxide (TCO).

3. The method according to claim 1, comprising in addition to removing parts of the semiconductor elements, removing parts of the conductive elements.

4. The method according to claim 1, comprising, in addition to removing parts of the semiconductor elements, removing part of the support layer.

5. The method according to claim 1, comprising applying the conductive elements and/or the semiconductor elements onto the support layer by means of scattering, dusting and/or printing, and thereafter incorporating said conductive elements and/or said semiconductor elements into the support layer.

6. The method according to claim 1, incorporating several conductive elements in the form of spherical or grain-shaped particles, in the form of strips or in the form of a paste into the support layer.

7. The method according to claim 1, comprising arranging the conductive elements and/or the semiconductor elements into a pattern using an auxiliary means and placing the elements onto and/or into the support layer using the auxiliary means.

8. The method according to claim 1, wherein the support layer is a matrix with recesses into which the elements are incorporated.

9. The method according to claim 1, comprising incorporating the elements into the support layer by means of a heating and/or pressing procedure.

10. The method according to claim 1, wherein a separation line comprising conductive elements extends between two edges of the support layer that are opposite from each other.

11. The method according to claim 1, comprising removing the elements and/or the support layer by grinding, polishing, etching, thermal energy input and/or by photolithographic processes.

12. The method according to claim 1, comprising applying the back contact layer and the front contact layer by a method selected from the group consisting of PVD methods, CVD methods and other methods that have been adapted to the type of the layer in question.

13. The method according to claim 1, comprising making the separation cuts using a method selected from the group consisting of cutting, scoring, etching, thermal energy input or by photolithographic processes.

14. The method according to claim 1, wherein the width of a separation line is in the order of magnitude of $B=10$ μm to 3 mm.

15. The method according to claim 1, wherein the distance between two separation lines is in the order of magnitude of 1 mm to 3 cm.

16. A serial connection of solar cells having integrated semiconductor elements, wherein the serial connection comprises:

an insulating support layer into which one or more conductive elements are incorporated in a pattern, wherein the conductive elements protrude from the surface of the support layer on at least one side of the support layer, and the pattern defines at least one separation line having a width B and comprising at least one conductive element;

a plurality of spherical or grain-shaped semiconductor elements in the insulating support layer wherein the semiconductor elements comprise a glass substrate core that is coated at least with one conductive back contact layer made of molybdenum and with one semiconductor layer made of a I-III-VI compound semiconductor, and the semiconductor elements protrude from the surface of the support layer on at least one side of the support layer and form a pattern in which the areas next to a separation line or between several separation lines are fitted with semiconductor elements;

a conductive front contact layer on one side of the support layer on which the elements protrude from the layer, the conductive front contact layer comprising a transparent conductive oxide (TCO) and having a continuous to surface (light incident) at a cross section through the spherical or grain-shaped elements;

a conductive back contact layer on the side of the support layer that is opposite from the front contact layer;

a layer made of intrinsic zinc oxide and a layer made of transparent conductive oxide (TCO) already on each of the spherical or grain-shaped semiconductor elements employed;

in each case, two separation cuts along a row of conductor elements wherein a first separation cut is made in the front contact layer and a second separation cut is made in the back contact layer, the separation cuts being on different sides of the row of conductive elements, and the separation cuts penetrate the conductive front contact layer comprising a TCO and the conductive back contact layer on the side of the support layer that is opposite from the front contact layer all the way to the support layer; and on the side of the support layer on which the back contact layer of the solar cell is arranged, at least one of the semiconductor elements has a surface via which a direct contact is established between the back contact layer of the solar cell and the back contact layer of the semiconductor element.

17. A serial connection according to claim 16, wherein the support layer comprises a thermoplastic material.

18. The serial connection according to claim 16, wherein the support layer comprises a polymer selected from the group consisting of epoxides, polyurethanes, polyacrylics, polycarbonates, polyesters, and polyimides.

19. The serial connection according to claim 16, wherein a conductive element is formed by a paste or by a strip.

20. The serial connection according to claim 16, wherein a conductive element is formed by a spherical or grain-shaped particle.

21. The serial connection according to claim 20, wherein a conductive element comprises a conductive material in the form of a solid material, or a substrate core that is coated with a conductive material.

22. The serial connection according to claim 21, wherein a conductive element comprises copper in the form of a solid material or of a substrate core that is coated with copper.

23. The serial connection according to claim 16, wherein the semiconductor elements comprises a layer made of transparent conductive oxide (TCO).

24. The serial connection according to claim 16, wherein the separation line comprising conductive elements is essentially straight and extends between two edges of the support layer that are opposite from each other.

25. The serial connection according to claim 16, wherein the width B of a separation line is 10 µm to 3 mm.

26. The serial connection according to claim 16, wherein a distance between two separation lines is 1 mm to 3 cm.

27. The serial connection according to claim 16, wherein the back contact layer comprises a metal, a transparent conductive oxide (TCO) or a conductive polymer.

28. The serial connection according to claim 27, wherein the back contact layer comprises a polymer selected from the group consisting of epoxy resins, polyurethanes, and polyimides having conductive particles selected from the group consisting of carbon, indium, nickel, silver, molybdenum, iron, nickel chromium, aluminum and corresponding alloys or oxides.

29. The serial connection according to claim 28, wherein the back contact layer comprises an intrinsic conductive polymer.

30. The serial connection according to claim 16, wherein the separation cuts are filled up with an insulating material.

31. The serial connection according to claim 16, wherein the serial connection is strip-like.

32. The serial connection according to claim 16, wherein a width of the serial connection is 5 cm to 30 cm.

33. The serial connection according to claim 16, wherein the serial connection is joined to another serial connection in such a way that the back contact layer is in contact with a front contact layer of the other serial connection.

34. The serial connection according to claim 33, wherein the serial connection is joined to at least another serial connection in a shingle-like configuration, whereby the back contact layer lies on a front contact layer or the front contact layer lies on a back contact layer of the other serial connection.

35. The serial connection according to claim 33, wherein the back contact layer is joined by a conductive adhesive to a front contact layer of the other serial connection.

36. A photovoltaic module, characterized in that it comprises a serial connection according to claim 16.

37. The method according to claim 1, wherein the width of a separation line is in the order of magnitude of B=between 10 µm and 500 µm.

38. The method according to claim 1, wherein the distance between two separation lines is in the order of magnitude of between 3 mm and 5 mm.

39. The serial connection according to claim 16, wherein the width B of a separation line is between 10 µm and 500 µm.

40. The serial connection according to claim 16, wherein a distance between two separation lines is between 3 mm and 5 mm.

41. The serial connection according to claim 16, wherein a width of the serial connection is 5 cm to 30 cm.

42. The serial connection according to claim 34, wherein the back contact layer is joined by a conductive adhesive to a front contact layer of the other serial connection.

43. A serial connection according to claim 16, wherein the conductive front contact layer comprising a transparent conductive oxide (TCO) is a deposited layer on the support layer and conductive elements.

\* \* \* \* \*